United States Patent [19]

Fukusho

[11] Patent Number: 5,401,679
[45] Date of Patent: Mar. 28, 1995

[54] METHOD OF MANUFACTURING CHARGE TRANSFER DEVICE

[75] Inventor: Takashi Fukusho, Kanagawa, Japan

[73] Assignee: Sony Corporation, Tokyo, Japan

[21] Appl. No.: 18,389

[22] Filed: Feb. 17, 1993

[30] Foreign Application Priority Data

Feb. 17, 1992 [JP] Japan .................................. 4-029742

[51] Int. Cl.$^6$ .................. H01L 21/265; H01L 21/70; H01L 27/00
[52] U.S. Cl. ......................................... 437/50; 437/53
[58] Field of Search .............................. 437/50, 53, 29; 257/221, 235, 236, 237, 238, 239, 240

[56] References Cited

U.S. PATENT DOCUMENTS

| | | | |
|---|---|---|---|
| 4,087,832 | 5/1978 | Jambotkar | 357/24 |
| 4,613,402 | 9/1986 | Losee et al. | 156/643 |
| 4,814,844 | 3/1989 | Bluzer | 257/236 |
| 5,065,203 | 11/1991 | Yang et al. | 257/221 |
| 5,238,863 | 8/1993 | Fukusho et al. | 437/53 |
| 5,292,682 | 3/1994 | Stevens et al. | 437/53 |
| 5,298,448 | 3/1994 | Stevens et al. | 437/53 |

FOREIGN PATENT DOCUMENTS

0253704  1/1988  Germany .............................. 437/53

Primary Examiner—Olik Chaudhuri
Assistant Examiner—Brian K. Dutton
Attorney, Agent, or Firm—Hill, Steadman & Simpson

[57] ABSTRACT

To manufacture a charge transfer device, a first insulating film is deposited on a surface of a semiconductor substrate as a charge transfer region for transferring charge packets therein in one direction. Then, a plurality of first transfer electrodes are deposited on the first insulating film, the first transfer electrodes being spaced from each other, and a portion of each of the first transfer electrodes is removed to shape each of the first transfer electrodes into a staircase configuration. Thereafter, a first impurity is ion-implanted into the surface of the semiconductor substrate to create an impurity-diffused region therein which includes first and second different-potential subregions underneath each of the first transfer electrodes and a different-potential subregion underneath each of areas of the first insulating film between the first transfer electrodes. After the first impurity is ion-implanted, a mask is deposited on portions of the areas of the first insulating film and on side portions of the first transfer electrodes, and a second impurity is ion-implanted into the surface of the semiconductor substrate to divide the different-potential subregion underneath each of the areas into third and fourth different-potential subregions.

20 Claims, 17 Drawing Sheets

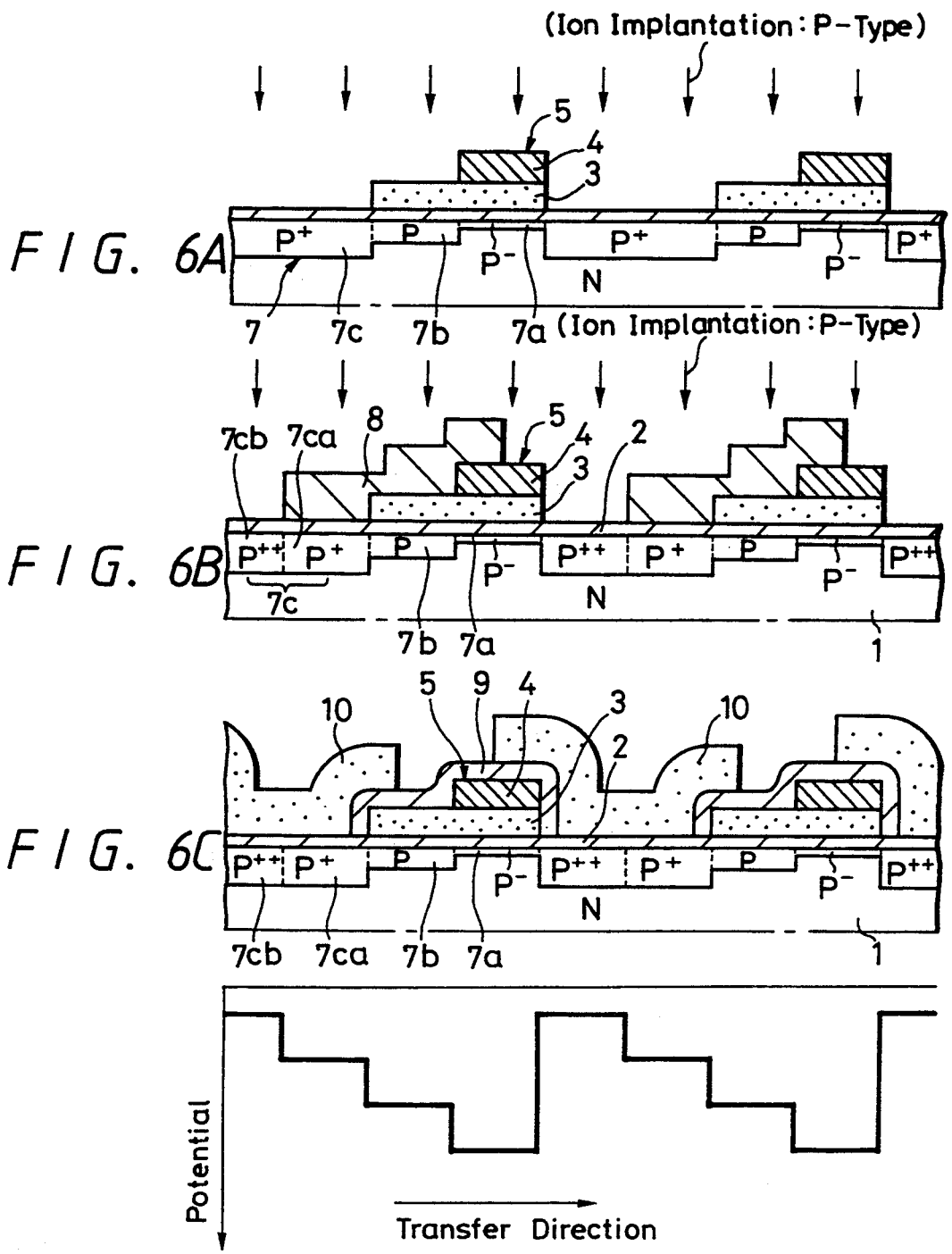

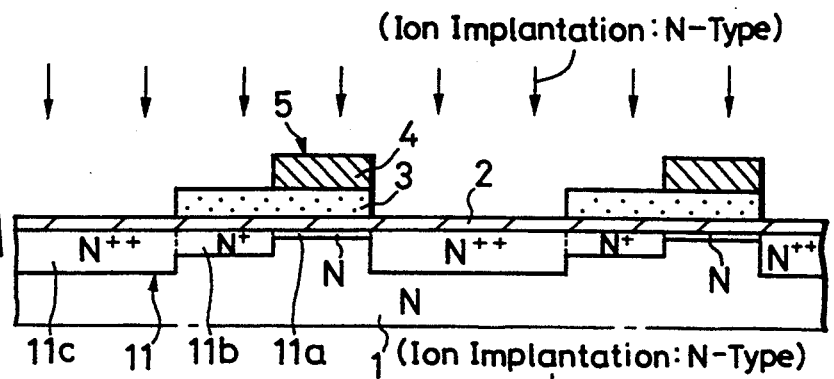
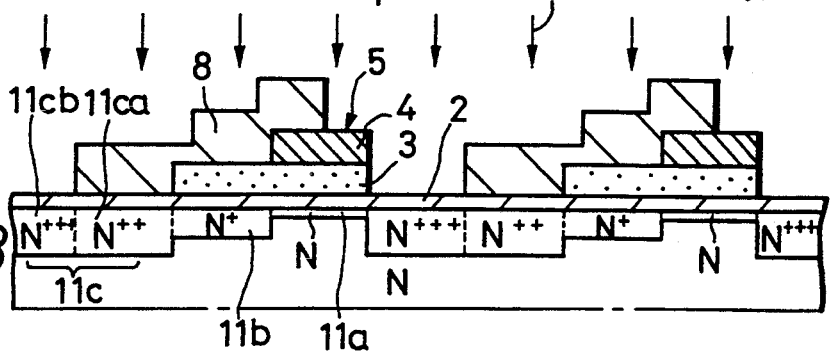
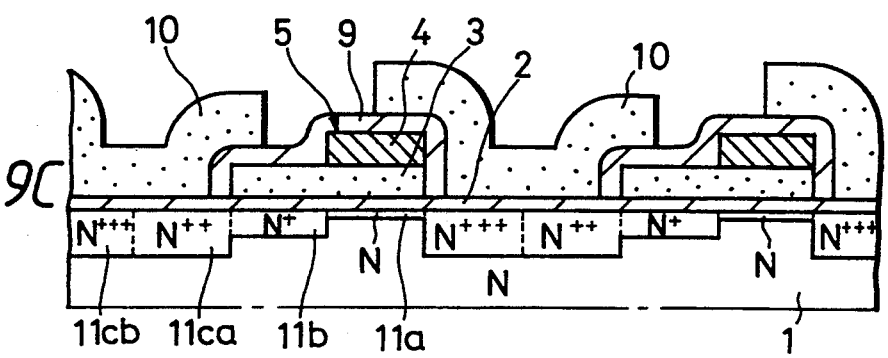
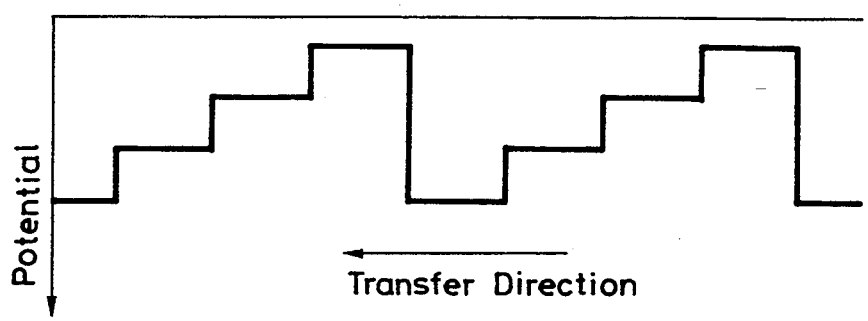

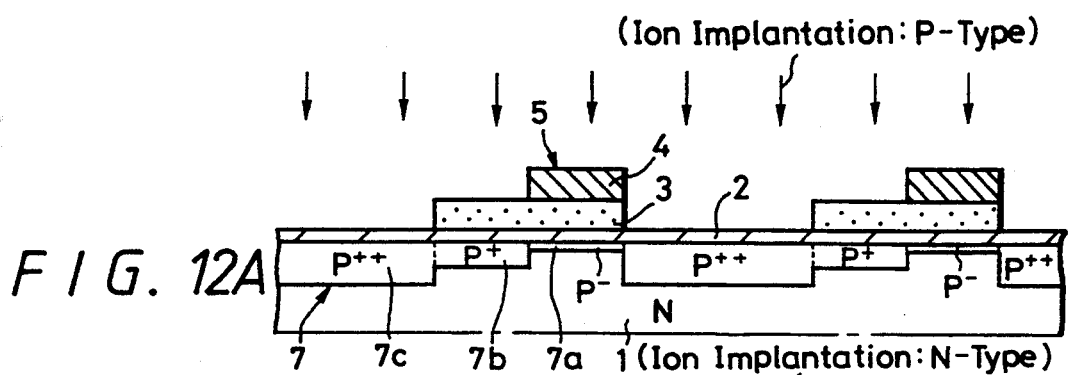
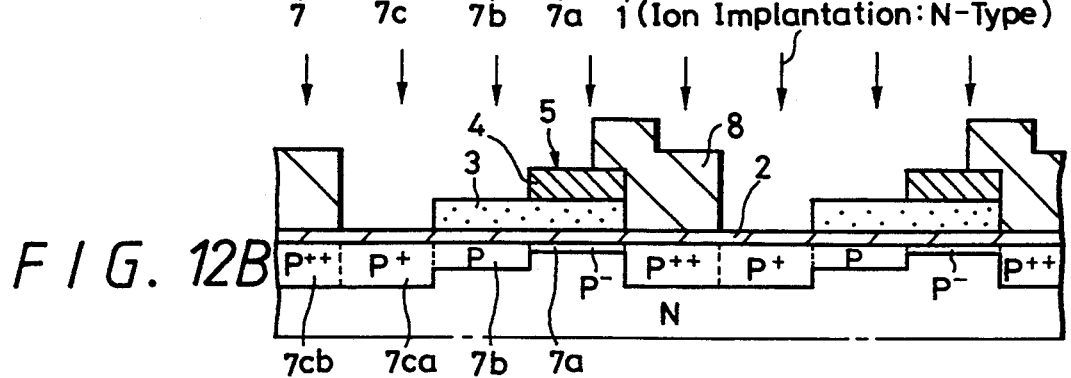
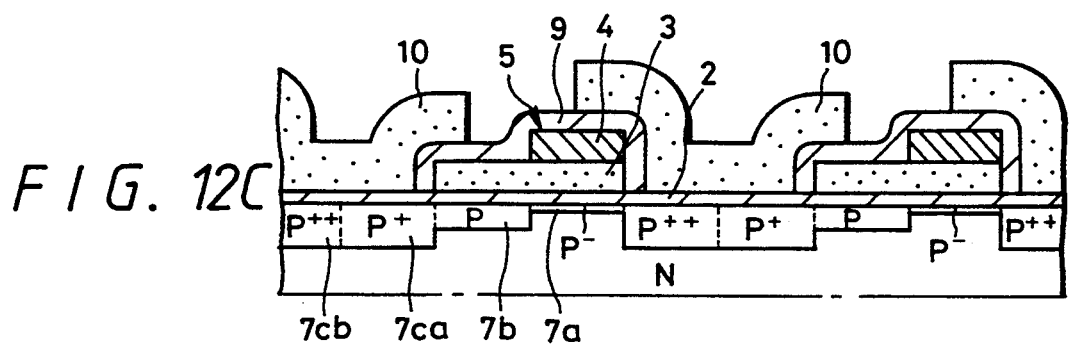
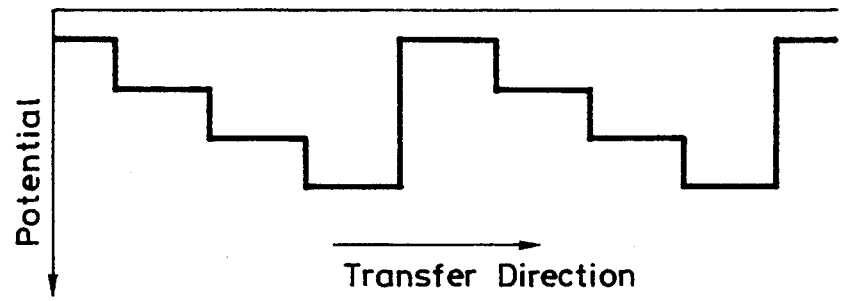

F I G. 16
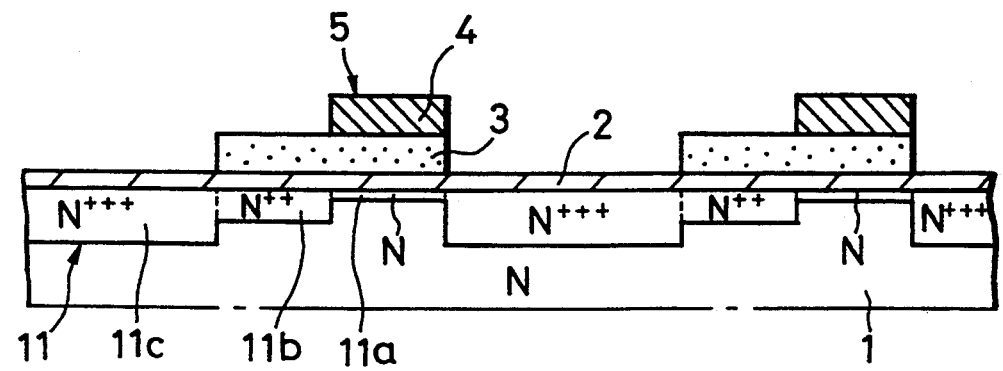
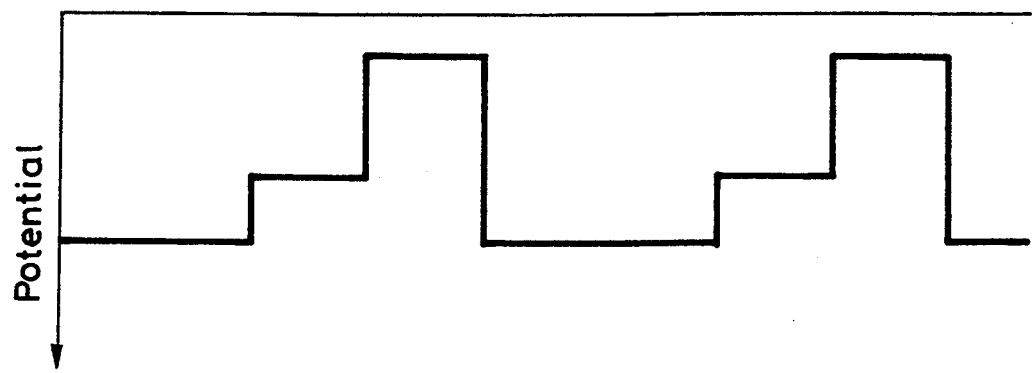
F I G. 17
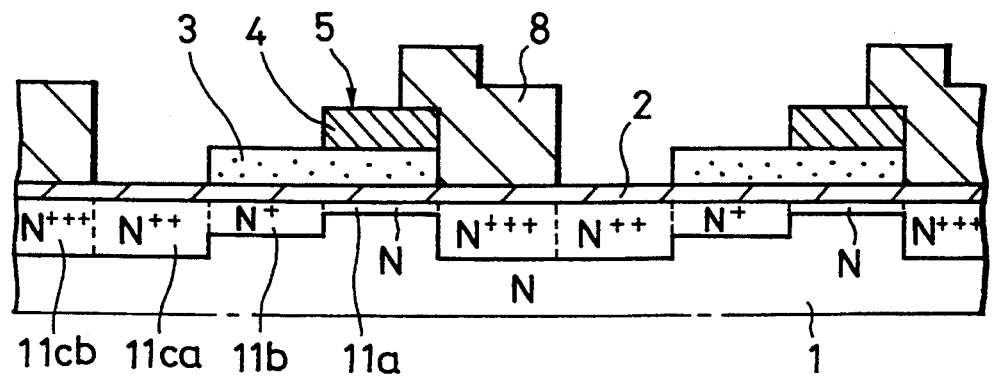
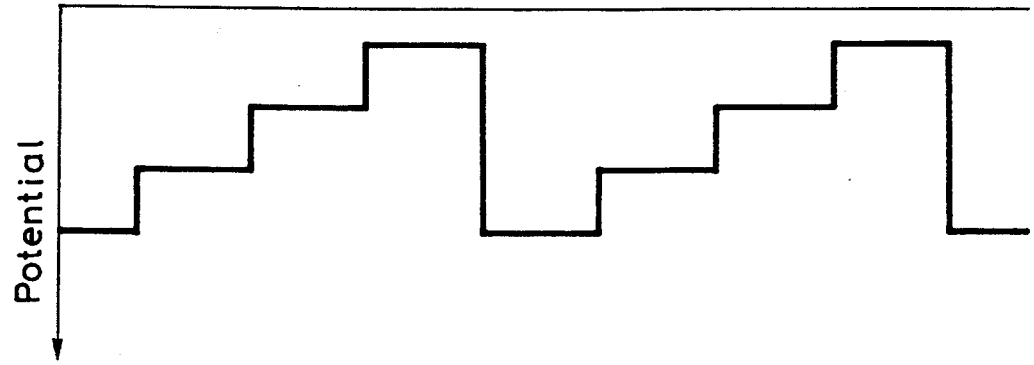

Transfer Direction

METHOD OF MANUFACTURING CHARGE TRANSFER DEVICE

BACKGROUND OF THE INVENTION

1. Field of the Invention

The present invention relates to a method of manufacturing a charge transfer device such as a charge-coupled device (CCD), and more particularly to a method of manufacturing a charge transfer device with a high charge transfer efficiency.

2. Description of the Prior Art

It is generally known that charge transfer devices in the form of CCDs are suitable for use as self-scanning imagers as they convert detected light into a signal charge for photogenerated charge packet storage and transfer.

As shown in FIG. 1 of the accompanying drawings, one general self-scanning solid-state CCD imager comprises an imaging area 23 composed of photosensors 21 for converting detected light into signal charge packets and vertical registers 22, and a horizontal register 25 for transferring the signal charge packets from the vertical registers 23 to an output area 24 per horizontal scanning line of television.

As shown in FIG. 2 of the accompanying drawings, the horizontal register 25 comprises an N-type impurity-diffused region or charge transfer region 31 fabricated in a silicon substrate, for example. On the charge transfer region 31, there are disposed a gate insulating film 32 with first and second horizontal transfer electrodes 33, 34 disposed thereon as first and second polycrystalline silicon layers. These two horizontal transfer electrodes 33, 34 are combined in an array, and a plurality of such arrays are successively arranged horizontally. An interlayer insulation film 35 is interposed between the first and second horizontal transfer electrodes 33, 34 of each pair. Each pair of two adjacent horizontal transfer electrodes 33, 34 serves as one transfer stage. Signal charge packets are successively transferred in one direction when two-phase drive pulses in opposite phase are applied to alternate transfer stages.

When the same potential is applied to the transfer electrodes 33, 34, a so-called fringing electric field develops underneath the interlayer insulation films 35 between the transfer electrodes 33, 34. The fringing electric field generates potential dips or potential pockets d beneath the interlayer insulation films 35, preventing the charge packets from being completely transferred.

One conventional configuration to avoid the above potential dips is shown in FIG. 3 of the accompanying drawings. In FIG. 3, a P-type impurity such as boron (B) is diffused into the charge transfer region 31 below the second transfer electrodes 34, for example, creating P-type impurity-diffused regions 36. In the solid-state CCD imager shown in FIG. 3, when the same potential is applied to the transfer electrodes 33, 34, the potential below the second transfer electrodes 34 is lower than the potential below the first transfer electrodes 33. The lower potential is referred to as an "implanted barrier" in general. Consequently, no potential dips occur beneath the interlayer insulation films 35 between the transfer electrodes 33, 34, with the result that the charge packets can be transferred with an improved charge transfer efficiency.

As the size of integrated circuit elements of solid-state CCD imagers becomes smaller and smaller, it is more difficult for the conventional solid-state CCD imager scheme shown in FIG. 3 to keep a good charge transfer efficiency while maintaining a desired dynamic range for the output signal because of the relationship between the amount of charge packets to be handled and the fringing electric field.

According to a known solution, an impurity is diffused below the first and second transfer electrodes 33, 34 with different densities along the direction in which the charge packets are transferred, creating a staircase-shaped potential gradient below the first and second transfer electrodes 33, 34 (see, for example, Japanese laid-open patent publication No. 2-280375).

To obtain such a staircase-shaped potential gradient, it has been proposed to form a photoresist mask over the charge transfer region 31 before the first and second transfer electrodes 33, 34 are formed, for the purpose of achieving different impurity densities in the surface of the charge transfer region 31 below the first and second transfer electrodes 33, 34.

More specifically, as shown in FIG. 4A of the accompanying drawings, after the gate insulating film 32 is disposed on the N-type charge transfer region 31, a photoresist film 37 is deposited on the entire surface of the gate insulating film 32. Thereafter, openings 37a are formed in the photoresist film 37 in portions of its areas over which the first and second transfer electrodes 33, 34 are to be formed. Subsequently, an N-type impurity is ion-implanted into the N-type charge transfer region 31, forming high-density N-type impurity-diffused regions 38 in the surface of the charge transfer region 31.

Then, as shown in FIG. 4B of the accompanying drawings, the photoresist film 37 is removed, and thereafter first transfer electrodes 33 are formed as a first polycrystalline silicon layer on the gate insulating film 32. As shown in FIG. 4C of the accompanying drawings, an interlayer insulation film 35 is selectively formed on the first transfer electrodes 33, after which a second polycrystalline silicon layer is deposited on the surface formed so far. The second polycrystalline silicon layer is then patterned into second transfer electrodes 34. The N-type impurity-diffused regions 38 are now positioned below portions of the first and second transfer electrodes 33, 34.

However, the positional alignment between the N-type impurity-diffused regions 38 and the first transfer electrodes 33 may suffer errors depending on the accuracy of the photoresist mask registration. Therefore, the above fabrication process tends to bring about characteristic degradations particularly in solid-state CCD imagers with smaller integrated circuit elements.

OBJECTS AND SUMMARY OF THE INVENTION

It is therefore an object of the present invention to provide a method of manufacturing a charge transfer device which has a staircase-shaped potential gradient that is achieved below transfer electrodes by different impurity densities along the direction in which charge packets are transferred, the method being capable of self-aligning the different impurity densities after the transfer electrodes are formed, so that the efficiency with which the charge packages are transferred is increased.

According to the present invention, there is provided a method of manufacturing a charge transfer device, comprising the steps of depositing a first insulating film on a surface of a semiconductor substrate as a charge transfer region for transferring charge packets therein in one direction, depositing a plurality of first transfer electrodes on the first insulating film, the first transfer electrodes being spaced from each other, removing a portion of each of the first transfer electrodes to shape each of the first transfer electrodes into a staircase configuration, implanting a first impurity into the surface of the semiconductor substrate to create an impurity-diffused region therein which includes first and second different-potential subregions underneath each of the first transfer electrodes and a different-potential subregion underneath each of areas of the first insulating film between the first transfer electrodes, depositing a mask on portions of the areas of the first insulating film and on side portions of the first transfer electrodes, and implanting a second impurity into the surface of the semiconductor substrate to divide the different-potential subregion underneath each of the areas into third and fourth different-potential subregions.

According to the present invention, there is also provided a method of manufacturing a charge-coupled device, comprising the steps of depositing a first insulating film on a surface of a semiconductor substrate as a charge transfer region for transferring charge packets therein in one direction, depositing a plurality of first transfer electrodes on the first insulating film, the first transfer electrodes being spaced from each other, each of the first transfer electrodes comprising a first film on the first insulating film and a second film on the first film, removing a portion of the second film of each of the first transfer electrodes to shape each of the first transfer electrodes into a staircase configuration, implanting a first impurity into the surface of the semiconductor substrate to create an impurity-diffused region therein which includes first and second different-potential subregions underneath each of the first transfer electrodes and a different-potential subregion underneath each of areas of the first insulating film between the first transfer electrodes, depositing a mask on portions of the areas of the first insulating film and on side portions of the first transfer electrodes, implanting a second impurity into the surface of the semiconductor substrate to divide the different-potential subregion underneath each of the areas into third and fourth different-potential subregions, removing the mask, depositing a second insulating film on each of the first transfer electrodes, and depositing a plurality of second transfer electrodes in the areas, respectively.

According to the present invention, there is further provided a method of manufacturing a charge transfer device, comprising the steps of depositing a first insulating film on a surface of a semiconductor substrate as a charge transfer region for transferring charge packets therein in one direction, depositing a plurality of first transfer electrodes on the first insulating film, the first transfer electrodes being spaced from each other, removing a portion of each of the first transfer electrodes to shape each of the first transfer electrodes into a staircase configuration, implanting an impurity into the surface of the semiconductor substrate to create an impurity-diffused region therein which includes a plurality of different-potential subregions underneath each of the first transfer electrodes in a pattern corresponding to the staircase configuration and a third different-potential subregion underneath each of areas of the first insulating film between the first transfer electrodes, depositing a second insulating film on each of the first transfer electrodes, and depositing a plurality of second transfer electrodes in the areas, respectively.

The above and other objects, features, and advantages of the present invention will become apparent from the following description of illustrative embodiments thereof to be read in conjunction with the accompanying drawings, in which like reference numerals represent the same or similar objects.

BRIEF DESCRIPTION OF THE DRAWINGS

FIGS. 5A through 5C and 6A through 6C are fragmentary cross-sectional views showing a process of fabricating a horizontal register in a solid-state CCD imager according to the present invention;

FIGS. 9A through 9C are fragmentary cross-sectional views showing a process of fabricating a horizontal register in a solid-state CCD imager according to a first modification of the present invention;

FIGS. 12A through 12C are fragmentary cross-sectional views showing a process of fabricating a horizontal register in a solid-state CCD imager according to a second modification of the present invention;

FIG. 16 is a fragmentary cross-sectional view showing potentials in a charge transfer region after a first impurity implantation stage shown in FIG. 15A;

FIG. 17 is a fragmentary cross-sectional view showing potentials in the charge transfer region after a second impurity implantation stage shown in FIG. 15B.

DETAILED DESCRIPTION OF THE PREFERRED EMBODIMENTS

Figure 1:
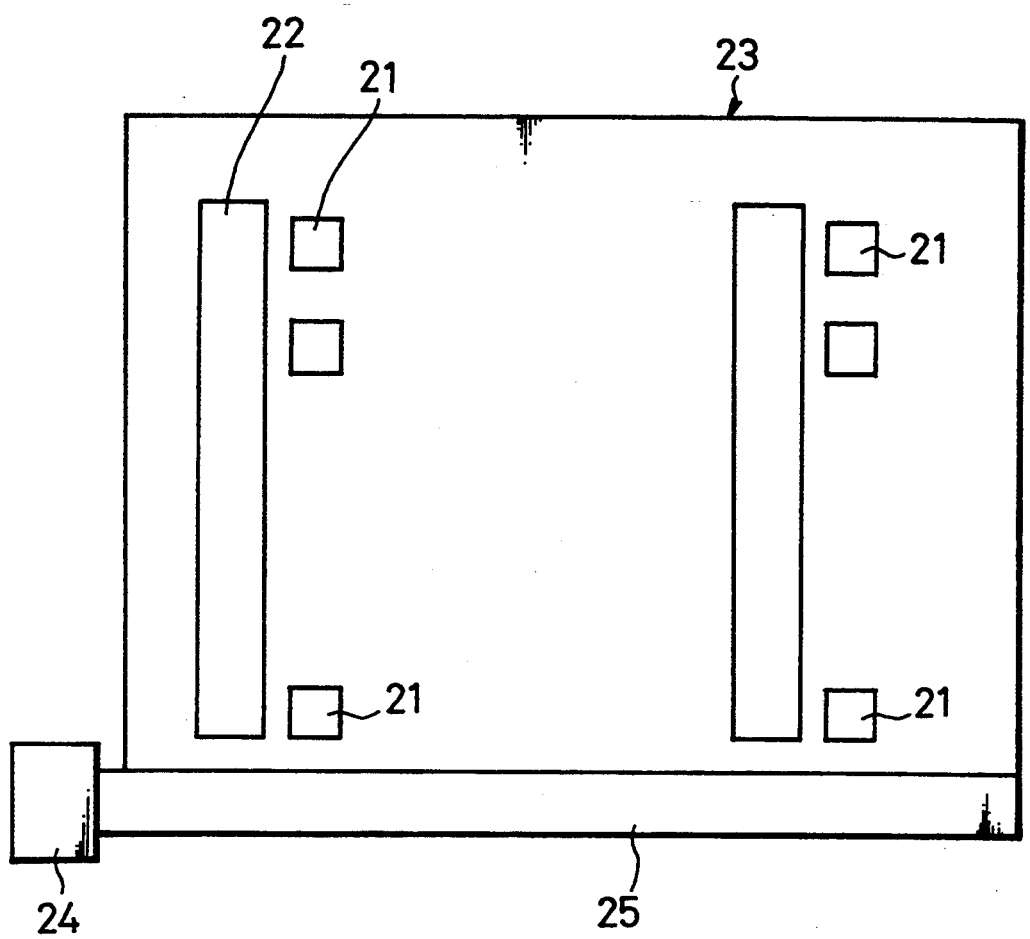
FIG. 1 is a schematic plan view of a prior art general solid-state CCD imager.
Figure 2:
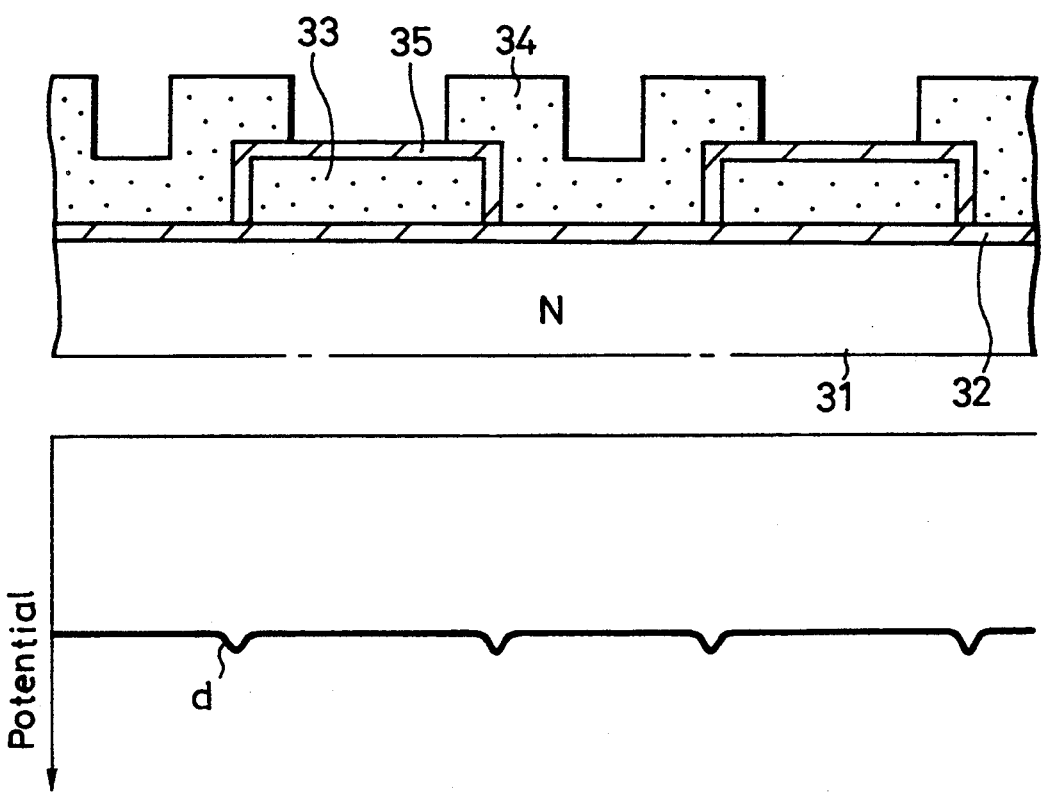
FIG. 2 is a fragmentary cross-sectional view of a prior art conventional horizontal register of a solid-state CCD imager, the view also showing potentials in the horizontal register.
Figure 3:
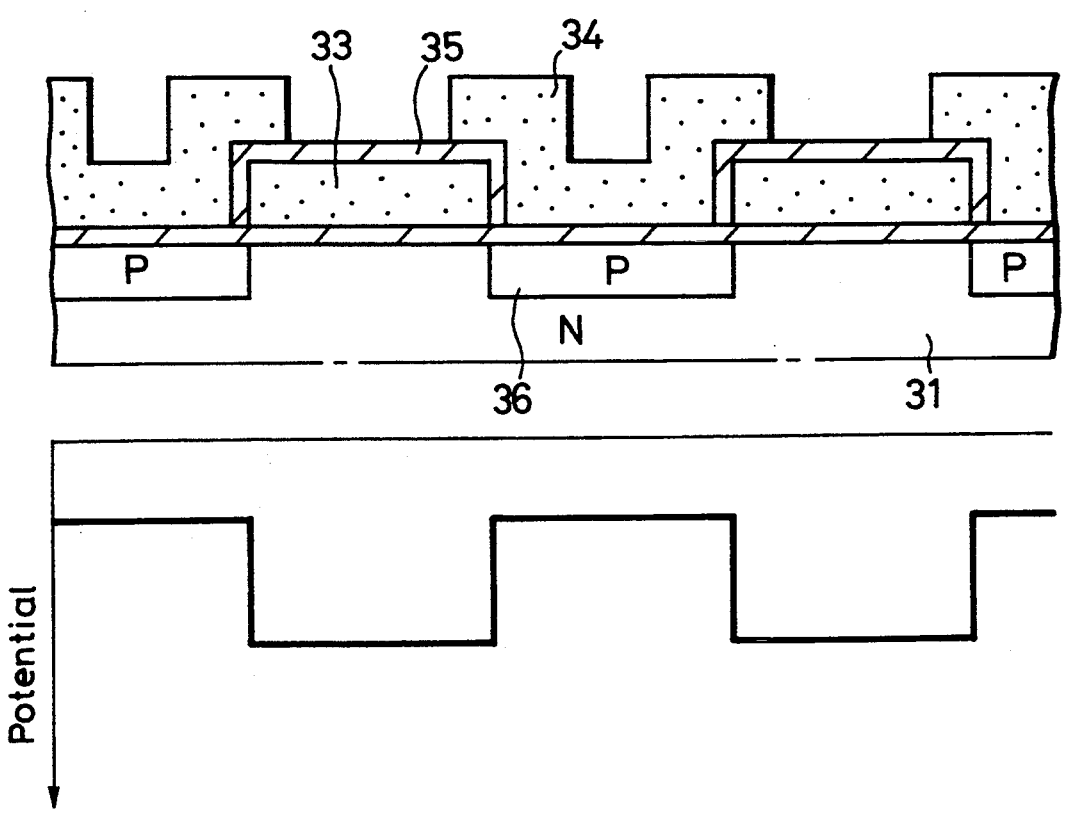
FIG. 3 is a fragmentary cross-sectional view of another prior art conventional horizontal register of a solid-state CCD imager, the view also showing potentials in the horizontal register.
Figure 4A:
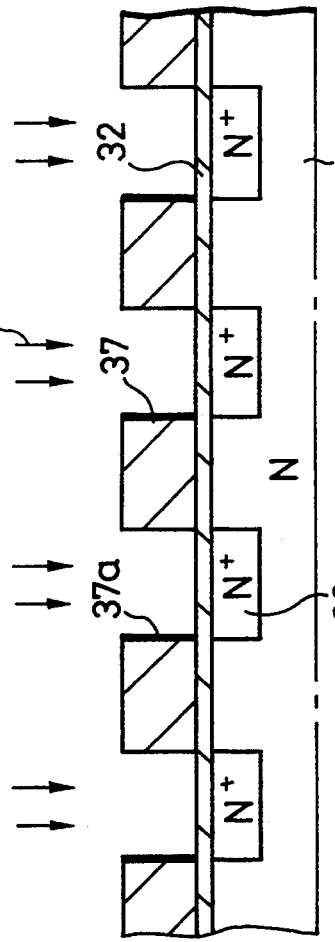
FIGS. 4A through 4C are fragmentary cross-sectional views showing a process of fabricating a horizontal register in a proposed solid-state CCD imager.
Figure 4B:
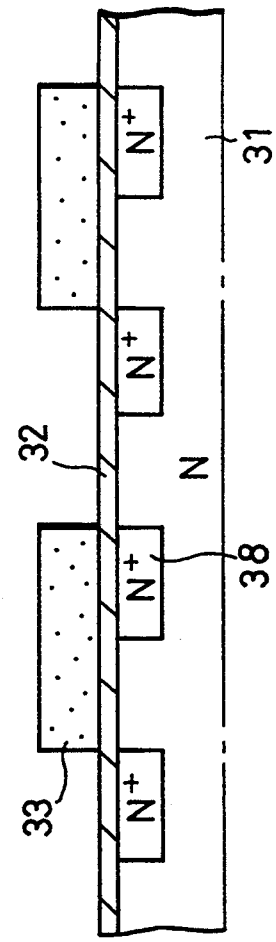
Figure 4C:
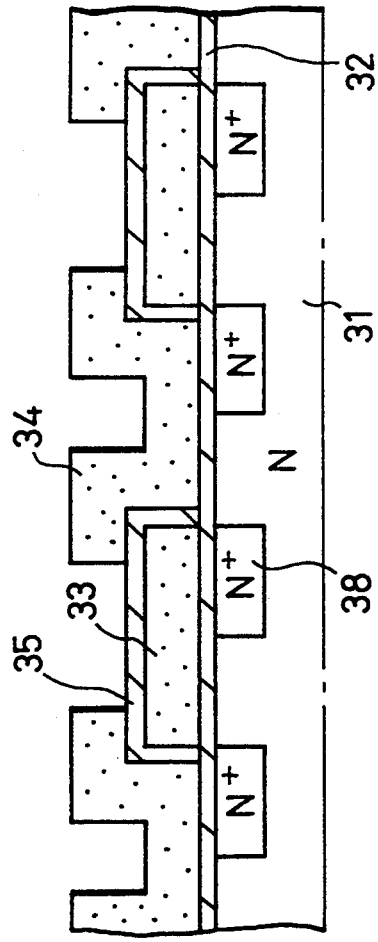

Like or corresponding parts are denoted by like or corresponding reference characters throughout views.

FIGS. 5A through 5C and 6A through 6C show process of fabricating a horizontal register in a solid-state CCD imager according to the present invention.

Figures 5A, 5B, 5C:
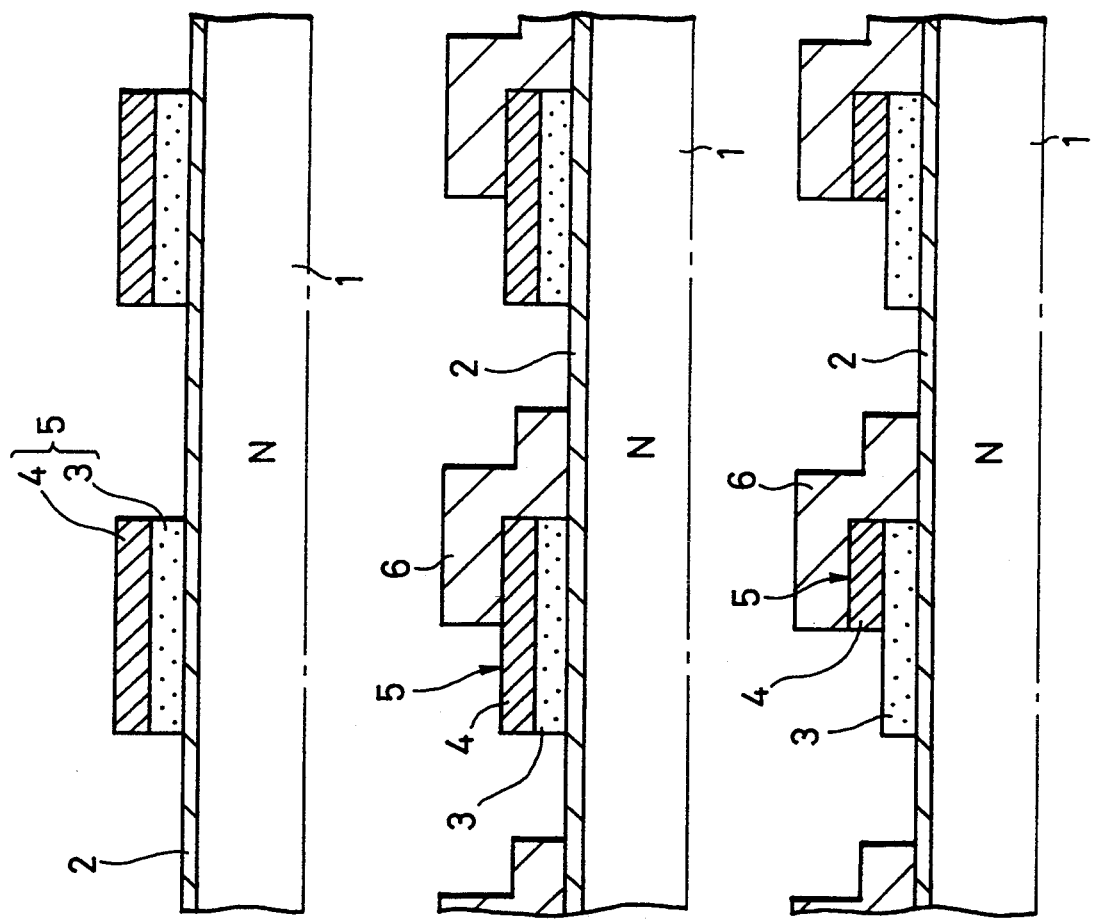

As shown in FIG. 5A, a gate insulating film 2 made of an insulating material combined with $SiO_2$ or SiN is formed on a charge transfer region 1 in an N-type well region of a semiconductor substrate. Thereafter, a polycrystalline silicon film 3 and a metal or metal silicide film 4 are successively deposited on the gate insulating film 2. The polycrystalline silicon film 3 and the metal or metal silicide film 4 are patterned into islands serving as first transfer electrodes 5 of polyside structure which are spaced from each other.

Then, as shown in FIG. 5B, a photoresist film 6 is deposited over the entire surface formed so far, and then exposed and developed so that the photoresist film 6 remains on partial surfaces of the metal or metal silicide film 4 and the gate insulating film 2. In the illustrated embodiment, the photoresist film 6 remains in such a pattern that a substantially left half of each island of the metal or metal silicide film 4 of the first transfer electrodes 5 is exposed.

Thereafter, as shown in FIG. 5C, the exposed portion of each island of the metal or metal silicide film 4 is etched away in a dry etching process using a reactive gas, e.g., a mixed gas of $SF_6$, $Cl_2$, $O_2$, which is not effective to etch the polycrystalline silicon film 3 and the gate insulating film 2. The first transfer electrodes 5 are now of a staircase shape. In the illustrated embodiment, the left half of each island of the metal or metal silicide film 4 is removed, with each of the first transfer electrodes 5 having a staircase-shaped left portion.

Then, as shown in FIG. 6A, a P-type impurity is ion-implanted into the surface of the charge transfer region 1, forming P-type impurity-diffused regions 7 therein. Each of the P-type impurity-diffused regions 7 has an impurity-diffused subregion 7a positioned below an overlap of the polycrystalline silicon film 3 and the metal or metal silicide film 4 of one of the first transfer electrodes 5. Since the impurity directed toward the impurity-diffused subregion 7a is partly absorbed, and the energy applied to ion-implant the impurity into the impurity-diffused subregion 7a is also partly absorbed, by the metal or metal silicide film 4, the polycrystalline silicon film 3, and the gate insulating film 2, the density of the P-type impurity in the impurity-diffused subregion 7a is relatively low, and the density peak thereof is relatively shallow.

The impurity can completely be prevented from being introduced into the charge transfer region 1 below the metal or metal silicide film 4 by suitably selecting conditions for the ion implantation. If the impurity is not introduced into the charge transfer region 1 below the metal or metal silicide film 4, then no impurity-diffused subregion 7a is formed underneath the overlap of the metal or metal silicide film 4 and the polycrystalline silicon film 3.

Each of the P-type impurity-diffused regions 7 also has an impurity-diffused subregion 7b positioned below the exposed portion of the polycrystalline silicon film 3 of one of the first transfer electrodes 5. Since the impurity directed toward the impurity-diffused subregion 7b is partly absorbed, and the energy applied to ion-implant the impurity into the impurity-diffused subregion 7b is also partly absorbed, by the polycrystalline silicon film 3 and the gate insulating film 2, the density of the P-type impurity in the impurity-diffused subregion 7b is higher than the impurity density in the impurity-diffused subregion 7a, and the density peak thereof is deeper.

Each of the P-type impurity-diffused regions 7 also has an impurity-diffused subregion 7c positioned below an area free of the first transfer electrodes 5, i.e., between adjacent two of the first transfer electrodes 5. Inasmuch the impurity directed toward the impurity-diffused subregion 7c is partly absorbed, and the energy applied to ion-implant the impurity into the impurity-diffused subregion 7c is also partly absorbed, by only the gate insulating film 2, the density of the P-type impurity in the impurity-diffused subregion 7c is highest in the P-type impurity-diffused region 7, and the density peak thereof is deepest.

Figure 7:
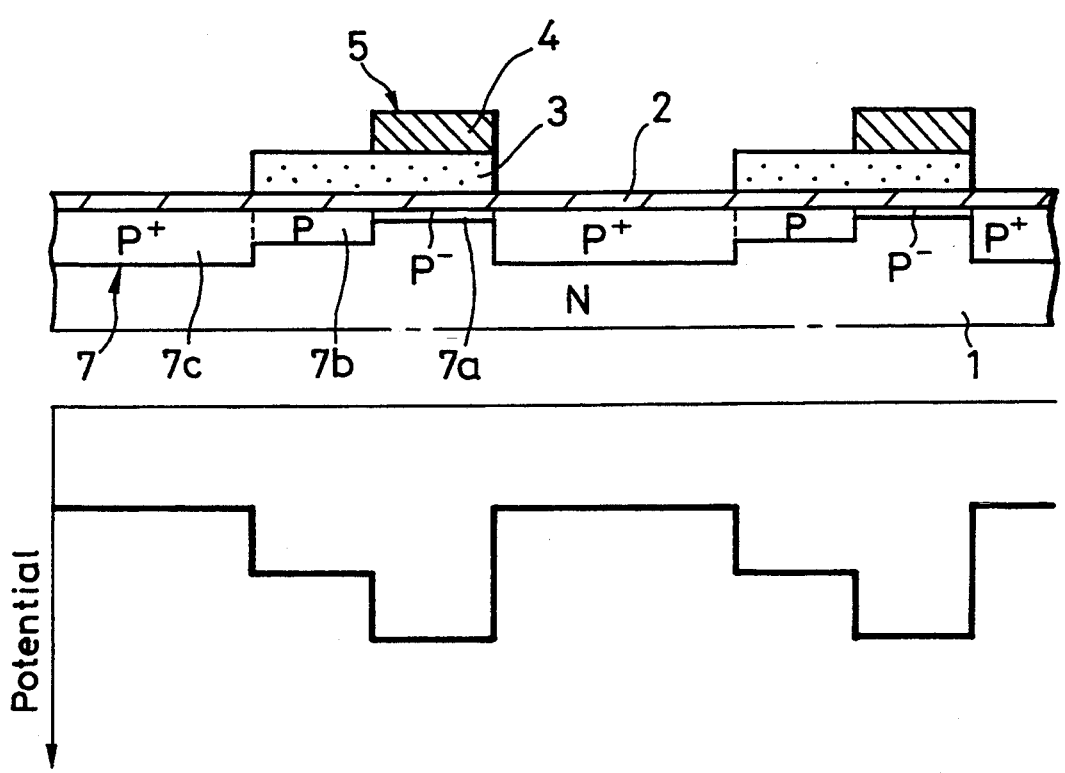
FIG. 7 is a fragmentary cross-sectional view showing potentials in a charge transfer region after a first impurity implantation stage shown in FIG. 6A.

As a result, as shown in FIG. 7, the potential in the charge transfer region 1 is highest (deepest) beneath each of the impurity-diffused subregions 7a, lower beneath each of the impurity-diffused subregions 7b, and lowest (shallowest) beneath each of the impurity-diffused subregions 7c.

As shown in FIG. 6B, a photoresist film 8 is deposited on the entire surface formed so far, and exposed and developed into such a pattern that the remaining photoresist film 8 covers at least one side wall of each of the first transfer electrodes 5, i.e., the staircase-shaped left side wall of each of the first transfer electrodes 5 in the illustrated embodiment, and that portions, e.g., left halves, of areas of the gate insulating film 2 which are free of the first transfer electrodes 5 are exposed upwardly.

Subsequently, a P-type impurity is ion-implanted again into the surface of the charge transfer region 1. Now, each of the impurity-diffused subregions 7c is composed of a subregion 7ca beneath an overlap of the photoresist film 8 and the gate insulating film 2, and a subregion 7cb beneath the exposed portion of each of the areas of the gate insulating film 2 which are free of the first transfer electrodes 5, the subregion 7cb having a higher impurity density than the subregion 7ca.

Figure 8:
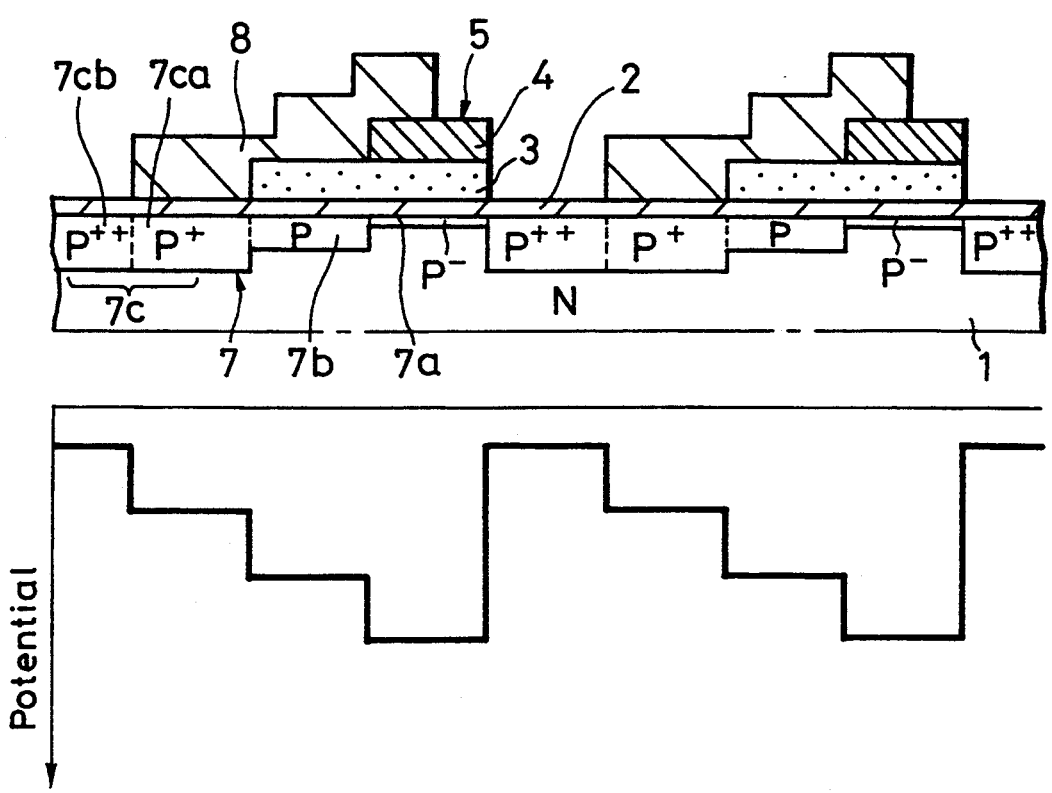
FIG. 8 is a fragmentary cross-sectional view showing potentials in the charge transfer region after a second impurity implantation stage shown in FIG. 6B.

As a consequence, as shown in FIG. 8, the potential in the charge transfer region 1 is highest beneath each impurity-diffused subregion 7a, lower beneath each impurity-diffused subregion 7b, much lower beneath each impurity-diffused subregion 7ca, and lowest beneath each impurity-diffused subregion 7cb.

In the above ion implantation process, conditions may be selected such that no impurity will be ion-implanted into the surface areas of the charge transfer region 1 underneath the overlaps of the polycrystalline silicon film 3 and the metal or metal silicide film 4.

Thereafter, as shown in FIG. 6C, after the photoresist film 8 is removed, the first polycide transfer electrodes 5 are thermally oxidized or an insulating interlayer film 9 is selectively formed on each of the first polyside transfer electrodes 5 by CVD. Subsequently, a second polycrystalline film is deposited on the entire surface formed so far, and patterned into second transfer electrodes 10 disposed partly over the interlayer film 9 and in the areas of the gate insulating film 2 which are free of the first transfer electrodes 5. In this manner, a horizontal register of a solid-state CCD imager is completed.

The potential distribution in the horizontal register thus fabricated is the same as shown in FIG. 8. That is, the potential distribution in the horizontal register is of a staircase shape increasing progressively, i.e., sloping downwardly (FIG. 6) to the right from each of the second transfer electrodes 10 to the corresponding first transfer electrode 5. Therefore, charge packets of electrons in the charge transfer region 1 are directed under the staircase-shaped potential distribution therein for highly efficient transfer in a transfer direction from the left to the right as shown in FIG. 6C.

As described above, since the metal or metal silicide film 4 is disposed on a portion of the first polycrystalline silicon film 3 in each of the first transfer electrodes 5, making the latter staircase-shaped, it is possible to form the self-aligned impurity-diffused subregions 7a, 7b, 7c of different impurity densities along the transfer direction below each of the first transfer electrodes 5 by way of the subsequent ion implantation of the P-type impurity.

In the step shown in FIG. 6B, the photoresist film 8 is patterned into a shape covering at least one side wall, i.e., the staircase-shaped side wall, of each of the first transfer electrodes 5, exposing portions of the gate insulating film 2, after which the P-type impurity is ion-implanted again into the charge transfer region 1. Therefore, it is possible to form the self-aligned impurity-diffused subregions 7ca, 7cb of different impurity densities along the transfer direction below each of the second transfer electrodes 10.

Specifically, after the first transfer electrodes 5 are formed, the impurity is implanted into the charge transfer region 1 below the first transfer electrodes 5 at self-aligned different densities along the transfer direction. The impurity is thereafter implanted again into the charge transfer region below the second transfer electrodes 10 at self-aligned different densities along the transfer direction. It is thus possible to develop a staircase-shaped potential distribution in the charge transfer region 1 which slopes downwardly from each of the second transfer electrodes 10 to the associated first transfer electrode 5.

Because the impurity differences are achieved in a self-aligned manner after the transfer electrodes are formed, the impurity-diffused regions 7 can be positionally aligned with the transfer electrodes, particularly the first transfer electrodes 5. Therefore, a charge transfer device, e.g., a solid-stage CCD imager, with smaller integrated circuit elements can be fabricated without characteristic degradations.

Modifications according to the present invention will now be described below.

FIGS. 9A through 9C, 10, and 11 show a process of fabricating a horizontal register in a solid-state CCD imager according to a first modification of the present invention. The process shown in FIGS. 9A through 9C, 10, and 11 differs from the process shown in FIGS. 5A through 5C, 6A through 6C, 7, and 8 in that an N-type impurity is introduced in the charge transfer region 1.

As shown in FIG. 9A, the metal or metal silicide film 4 on the polycrystalline silicon film 3 of each first transfer electrode 5 is selectively etched away so that the first transfer electrodes 5 are shaped into a staircase configuration. The staircase-shaped first transfer electrodes 5 can be formed in the same manner as the steps shown in FIGS. 5A through 6A.

Thereafter, as shown in FIG. 9A, an N-type impurity is ion-implanted into the surface of the charge transfer region 1, forming N-type impurity-diffused regions 11 therein. Each of the N-type impurity-diffused regions 11 has an impurity-diffused subregion 11a positioned below an overlap of the polycrystalline silicon film 3 and the metal or metal silicide film 4 of one of the first transfer electrodes 5. Since the impurity directed toward the impurity-diffused subregion 11a is partly absorbed, and the energy applied to ion-implant the impurity into the impurity-diffused subregion 11a is also partly absorbed, by the metal or metal silicide film 4, the polycrystalline silicon film 3, and the gate insulating film 2, the density of the N-type impurity in the impurity-diffused subregion 11a is substantially the same as the charge transfer region 1. The impurity may completely be prevented from being introduced into the charge transfer region 1 below the metal or metal silicide film 4 by suitably selecting conditions for the ion implantation.

Each of the N-type impurity-diffused regions 11 also has an impurity-diffused subregion 11b positioned below the exposed portion of the polycrystalline silicon film 3 of one of the first transfer electrodes 5. Since the impurity directed toward the impurity-diffused subregion 11b is partly absorbed, and the energy applied to ion-implant the impurity into the impurity-diffused subregion 11b is also partly absorbed, by the polycrystalline silicon film 3 and the gate insulating film 2, the density of the N-type impurity in the impurity-diffused subregion 11b is higher than the impurity density in the charge transfer region 1, and the density peak thereof is deeper, i.e., spaced relatively deeply from the surface of the charge transfer region 1.

Each of the N-type impurity-diffused regions 11 also has an impurity-diffused subregion 11c positioned below an area free of the first transfer electrodes 5. Inasmuch the impurity directed toward the impurity-diffused subregion 11c is partly absorbed, and the energy applied to ion-implant the impurity into the impurity-diffused subregion 11c is also partly absorbed, by only the gate insulating film 2, the density of the N-type impurity in the impurity-diffused subregion 11c is highest in the N-type impurity-diffused region 11, and the density peak thereof is deepest.

Figure 10:
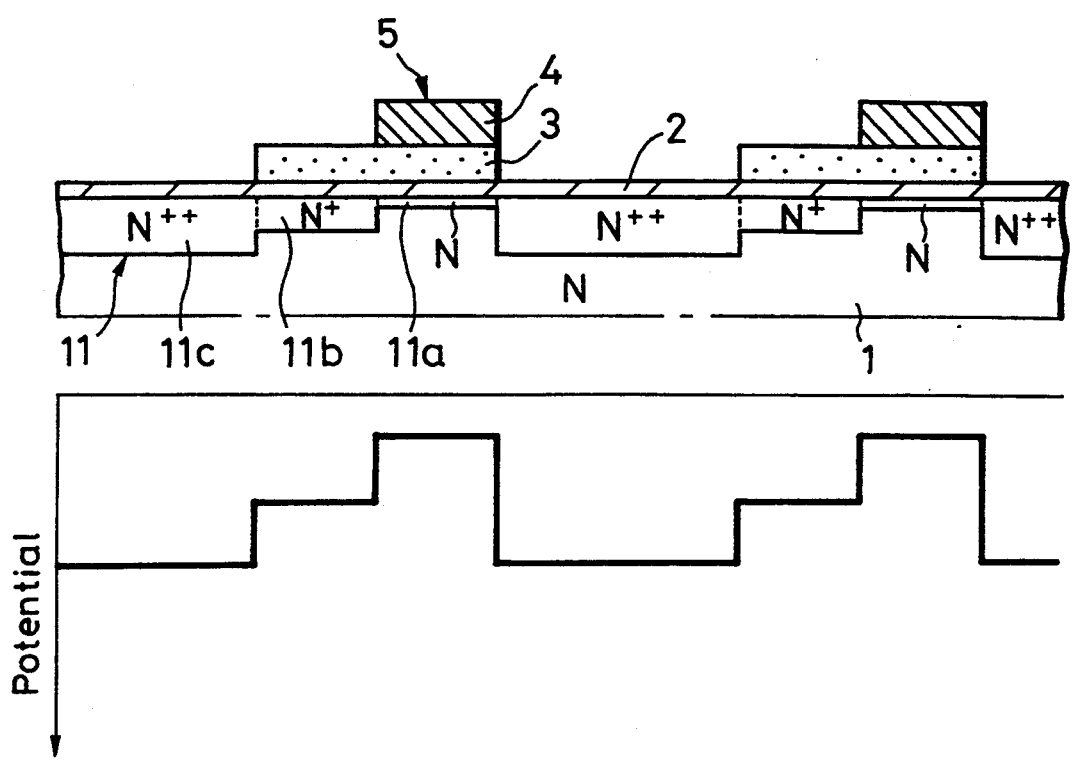
FIG. 10 is a fragmentary cross-sectional view showing potentials in a charge transfer region after a first impurity implantation stage shown in FIG. 9A.

As a result, as shown in FIG. 10, the potential in the charge transfer region 1 is highest beneath each of the impurity-diffused subregions 11c, lower beneath each of the impurity-diffused subregions 11b, and lowest beneath each of the impurity-diffused subregions 11a.

As shown in FIG. 9B, a photoresist film 8 is deposited on the entire surface formed so far, and exposed and developed into such a pattern that the remaining photoresist film 8 covers at least one side wall of each of the first transfer electrodes 5, i.e., the staircase-shaped left side wall of each of the first transfer electrodes 5 in the illustrated embodiment, and that portions, e.g., left halves, of areas of the gate insulating film 2 which are free of the first transfer electrodes 5 are exposed upwardly.

Subsequently, an N-type impurity is ion-implanted again into the surface of the charge transfer region 1. Now, each of the impurity-diffused subregions 11c is composed of a subregion 11ca beneath an overlap of the photoresist film 8 and the gate insulating film 2, and a subregion 11cb beneath the exposed portion of each of the areas of the gate insulating film 2 which are free of the first transfer electrodes 5, the subregion 11b having a higher impurity density than the subregion 11ca.

Figure 11:
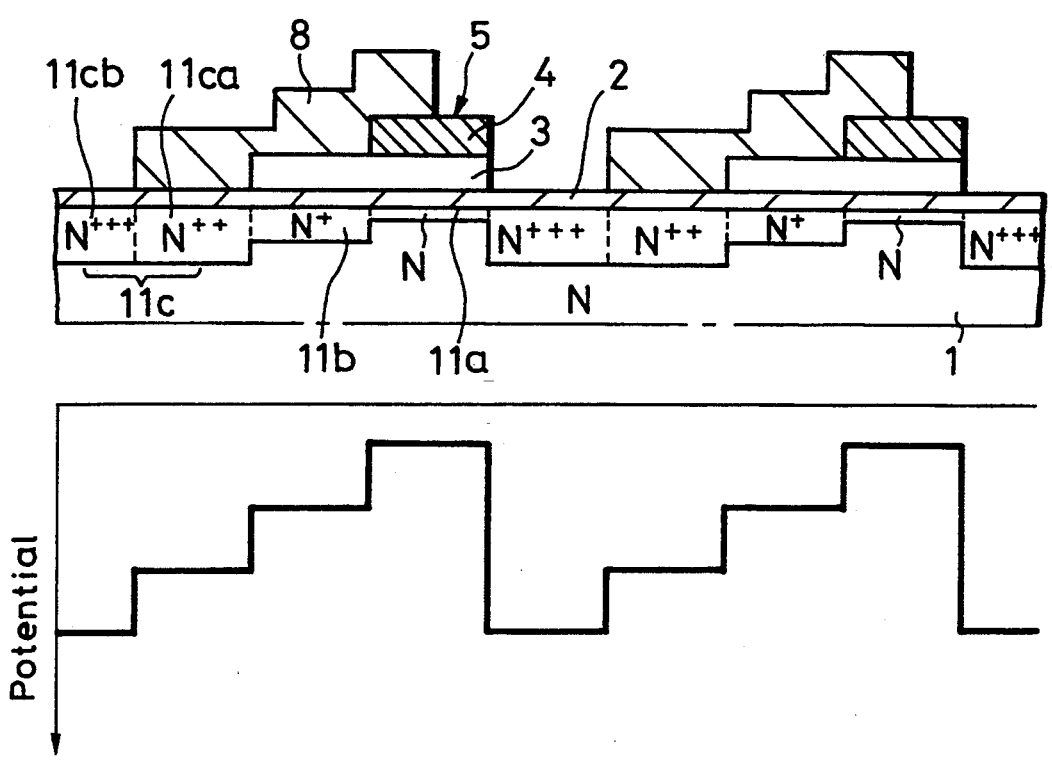
FIG. 11 is a fragmentary cross-sectional view showing potentials in the charge transfer region after a second impurity implantation stage shown in FIG. 9B.

As a consequence, as shown in FIG. 11, the potential in the charge transfer region 1 is lowest beneath each impurity-diffused subregion 11a, higher beneath each impurity-diffused subregion 11b, much higher beneath each impurity-diffused subregion 11ca, and highest beneath each impurity-diffused subregion 11cb.

In the above ion implantation process, conditions may be selected such that no impurity will be ion-implanted into the surface areas of the charge transfer region 1 underneath the overlaps of the polycrystalline silicon film 3 and the metal or metal silicide film 4.

Thereafter, as shown in FIG. 9C, after the photoresist film 8 is removed, the first polyside transfer electrodes 5 are thermally oxidized or an insulating interlayer film 9 is selectively formed on each of the first polyside transfer electrodes 5 by CVD. Subsequently, a second polycrystalline film is deposited on the entire surface formed so far, and patterned into second transfer electrodes 10. In this manner, a horizontal register of a solid-state CCD imager is completed according to the first modification.

The potential distribution in the horizontal register thus fabricated is the same as shown in FIG. 11. That is, the potential distribution in the horizontal register is of a staircase Shape increasing progressively, i.e., sloping downwardly (FIG. 9C) to the left from each of the first transfer electrodes 5 toward the corresponding second transfer electrode 10. Therefore, charge packets in the charge transfer region 1 can be transferred highly efficiently in a transfer direction from the right to the left as shown in FIG. 9C.

FIGS. 12A through 12C, 13, and 14 show a process of fabricating a horizontal register in a solid-state CCD imager according to a second modification of the present invention. The process shown in FIGS. 12A through 12C, 13, and 14 differs from the process shown in FIGS. 5A through 5C, 6A through 6C, 7, and 8 in that a P-type impurity and then an N-type impurity are introduced in the charge transfer region 1.

Figure 13:
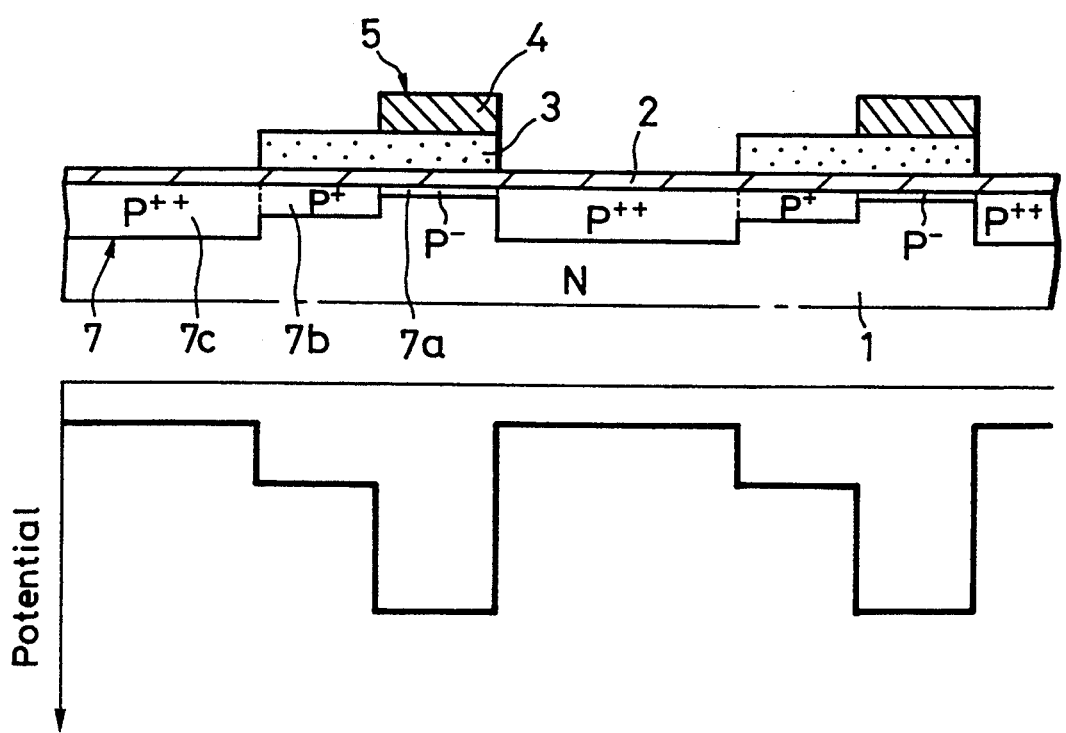
FIG. 13 is a fragmentary cross-sectional view showing potentials in a charge transfer region after a first impurity implantation stage shown in FIG. 12A.

As shown in FIG. 12A, the metal or metal silicide film 4 on the polycrystalline silicon film 3 of each first transfer electrode 5 is selectively etched away so that the first transfer electrodes 5 are shaped into a staircase configuration. Thereafter, a P-type impurity is ion-implanted into the surface of the charge transfer region 1, forming P-type impurity-diffused regions 11 therein each composed of subregions 7a, 7b, 7c. The staircase-shaped first transfer electrodes 5 and the P-type impurity-diffused subregions 7a, 7b, 7c can be formed in the same manner as the steps shown in FIGS. 5A through 5C and 6A. A potential distribution in the charge transfer region 1 at this time is shown in FIG. 13.

As shown in FIG. 12B, a photoresist film 8 is deposited on the entire surface formed so far, and exposed and developed into such a pattern that the remaining photoresist film 8 covers at least the opposite side wall of each of the first transfer electrodes 5, i.e., the left side wall opposite to the staircase-shaped side wall thereof in the illustrated embodiment, and that portions, e.g., right halves, of areas of the gate insulating film 2 which are free of the first transfer electrodes 5 are exposed upwardly.

Subsequently, an N-type impurity is ion-implanted again into the surface of the charge transfer region 1. Now, each of the impurity-diffused subregions 7c is composed of a subregion 7ca beneath the exposed portion of each of the areas of the gate insulating film 2 which are free of the first transfer electrodes 5, and a subregion 7cb beneath an overlap of the photoresist film 8 and the gate insulating film 2, and the subregions 7ca, 7b have their P-type impurity density lowered by the introduced N-type impurity.

Figure 14:
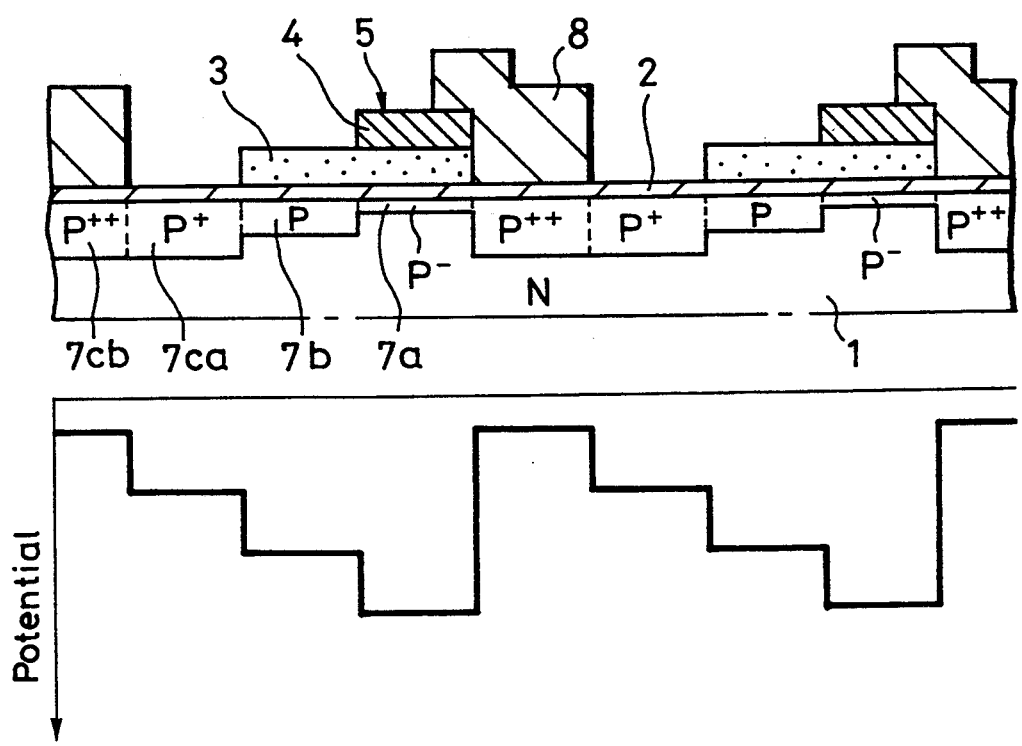
FIG. 14 is a fragmentary cross-sectional view showing potentials in the charge transfer region after a second impurity implantation stage shown in FIG. 12B.

As a consequence, as shown in FIG. 14, the potential in the charge transfer region 1 is highest beneath each impurity-diffused subregion 7a, lower beneath each impurity-diffused subregion 7b, much lower beneath each impurity-diffused subregion 7ca, and lowest beneath each impurity-diffused subregion 7cb.

In the above ion implantation process, conditions may be selected such that no impurity will be ion-implanted into the surface areas of the charge transfer region 1 underneath the overlaps of the polycrystalline silicon film 3 and the metal or metal silicide film 4.

Thereafter, as shown in FIG. 12C, after the photoresist film 8 is removed, the first polyside transfer electrodes 5 are thermally oxidized or an insulating interlayer film 9 is selectively formed on each of the first polyside transfer electrodes 5 by CVD. Subsequently, a second polycrystalline film is deposited on the entire surface formed so far, and patterned into second transfer electrodes 10. In this manner, a horizontal register of a solid-state CCD imager is completed according to the second modification.

The potential distribution in the horizontal register thus fabricated is the same as shown in FIGS. 6C and 14. That is, the potential distribution in the horizontal register is of a staircase shape increasing progressively, i.e., sloping downwardly (FIG. 12C) to the right from each of the second transfer electrodes 10 to the corresponding first transfer electrode 5. Therefore, charge packets in the charge transfer region 1 can be transferred highly efficiently in a transfer direction from the left to the right as shown in FIG. 12C.

FIGS. 15A through 15C, 16, and 17 illustrate a process of fabricating a horizontal register in a solid-state CCD imager according to a third modification of the present invention. The process shown in FIGS. 15A through 15C, 16, and 17 differs from the process according to the third embodiment in that an N-type impurity and then a P-type impurity are introduced in the charge transfer region 1.

Figure 15:
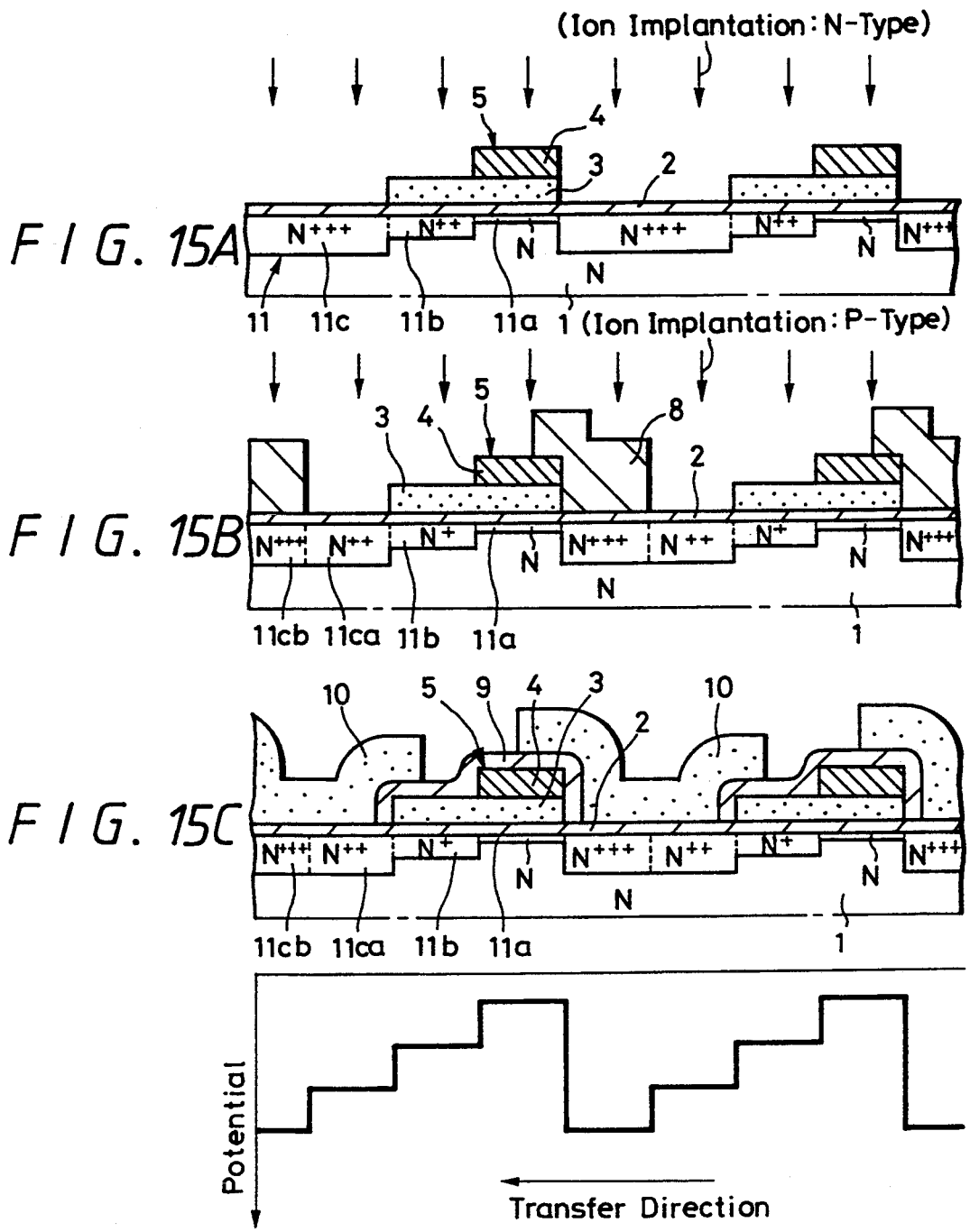
FIGS. 15A through 15C are fragmentary cross-sectional views showing a process of fabricating a horizontal register in a solid-state CCD imager according to a third modification of the present invention.

As shown in FIG. 15A, the metal or metal silicide film 4 on the polycrystalline silicon film 3 of each first transfer electrode 5 is selectively etched away so that the first transfer electrodes 5 are shaped into a staircase configuration. The staircase-shaped first transfer electrodes 5 can be formed in the same manner as the steps shown in FIGS. 5A through 5C.

Thereafter, an N-type impurity is ion-implanted into the surface of the charge transfer region 1, forming N-type impurity-diffused regions 11 therein each composed of subregions 11a, 11b, 11c. The N-type impurity-diffused subregions 11a, 11b, 11c can be formed in the same manner as the first modification shown in FIGS. 9A through 9C. A potential distribution in the charge transfer region 1 at this time is shown in FIG. 16.

As shown in FIG. 15B, a photoresist film 8 is deposited on the entire surface formed so far, and exposed and developed into such a pattern that the remaining photoresist film 8 covers at least the opposite side wall of each of the first transfer electrodes 5, i.e., the left side wall opposite to the staircase-shaped side wall thereof in the illustrated embodiment, and that portions, e.g., right halves, of areas of the gate insulating film 2 which are free of the first transfer electrodes 5 are exposed upwardly.

Subsequently, a P-type impurity is ion-implanted again into the surface of the charge transfer region 1. Now, each of the impurity-diffused subregions 11c is composed of a subregion 11ca beneath the exposed portion of each of the areas of the gate insulating film 2 which are free of the first transfer electrodes 5, and a subregion 11cb beneath an overlap of the photoresist film 8 and the gate insulating film 2, and the subregions 11ca, 11b have their N-type impurity density lowered by the introduced P-type impurity.

As a consequence, as shown in FIG. 17, the potential in the charge transfer region 1 is lowest beneath each impurity-diffused subregion 11a, higher beneath each impurity-diffused subregion 11b, much higher beneath each impurity-diffused subregion 11ca, and highest beneath each impurity-diffused subregion 11cb.

In the above ion implantation process, conditions may be selected such that no impurity will be ion-implanted into the surface areas of the charge transfer region 1 underneath the overlaps of the polycrystalline silicon film 3 and the metal or metal silicide film 4.

Thereafter, as shown in FIG. 15C, after the photoresist film 8 is removed, the first polyside transfer electrodes 5 are thermally oxidized or an insulating interlayer film 9 is selectively formed on each of the first polyside transfer electrodes 5 by CVD. Subsequently, a second polycrystalline film is deposited on the entire surface formed so far, and patterned into second transfer electrodes 10. In this manner, a horizontal register of a solid-state CCD imager is completed according to the third modification.

The potential distribution in the horizontal register thus fabricated is the same as shown in FIGS. 9C and 17. That is, the potential distribution in the horizontal register is of a staircase shape increasing progressively, i.e., sloping downwardly (FIG. 15C) to the left from each of the first transfer electrodes 5 to the corresponding second transfer electrode 10. Therefore, charge packets in the charge transfer region 1 can be transferred highly efficiently in a transfer direction from the right to the left as shown in FIG. 15C.

In the above embodiment and modifications, the first polyside transfer electrodes 5 are formed by successively depositing the polycrystalline silicon film 3 and the metal or metal silicide film 4 on the gate insulating film 2. However, any film other than the metal or metal silicide film 4, insofar as it has an etching rate different from those of the polycrystalline silicon film 3 and the gate insulating film 2, may be deposited on the polycrystalline silicon film 3 for the formation of the first polyside transfer electrodes 5.

While the second transfer electrodes 10 are formed in the above embodiment and modifications, the second transfer electrodes 10 may be dispensed with in a virtual phase CCD.

Figure 18:
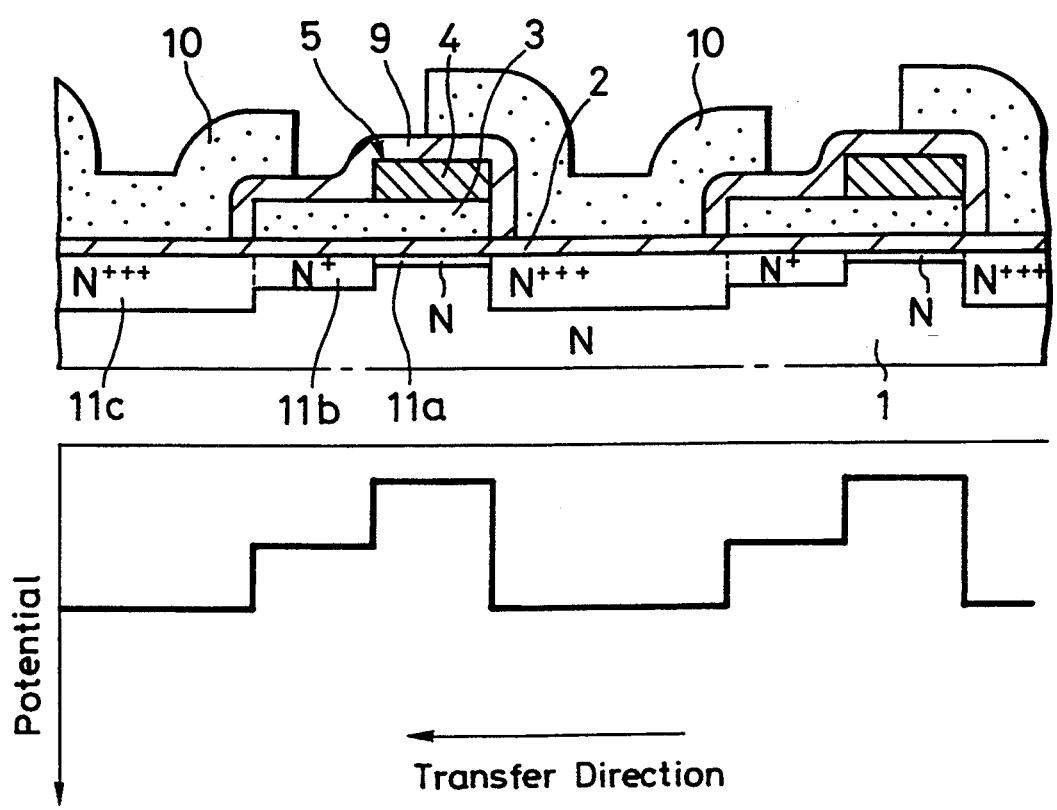
FIG. 18 is a fragmentary cross-sectional view showing a modified horizontal register and potentials developed therein.

In the above embodiment and modifications, no potential differences may be created below the second transfer electrodes 10. In such a modification, the interlayer film 9 is selectively deposited and then the second transfer electrodes 10 are formed immediately after the step shown in FIG. 15A, thus fabricating a horizontal register as shown in FIG. 18.

According to the above embodiment and modifications, in manufacturing a charge transfer device which has a staircase potential gradient that is achieved below transfer electrodes by different impurity densities along the direction in which charge packets are transferred, the different impurity densities can be formed in a self-aligned fashion after the transfer electrodes are formed, for thereby increasing the efficiency with which the charge packages are transferred.

Having described preferred embodiments of the invention with reference to the accompanying drawings, it is to be understood that the invention is not limited to that precise embodiments and that various changes and modifications could be effected by one skilled in the art without departing from the spirit or scope of the invention as defined in the appended claims.

What is claimed is:

1. A method of manufacturing a charge transfer device, comprising the steps of:

depositing a first insulating layer on a semiconductor substrate, the semiconductor substrate having a first conductivity type of charge transfer region for transferring charge packets therein in one direction;

forming a plurality of first transfer electrodes on the first insulating layer, the first transfer electrodes being spaced from each other;

removing a portion of each of the first transfer electrodes to shape each of the first transfer electrodes into a staircase configuration;

implanting an impurity into the surface of the semiconductor substrate to form an impurity diffusion region comprising a plurality of different subregions underneath each of first transfer electrodes in a pattern corresponding to said staircase configuration and forming a further subregion underneath each of the areas of the first insulating area between the first transfer electrodes, said plurality of subregions and said further subregions having different potentials relative to each other;

depositing a second insulating film on each of said first transfer electrodes; and depositing a plurality of second transfer electrodes in said areas, respectively.

2. A method of manufacturing a charge transfer device, comprising the steps of:

depositing a first insulating layer on a semiconductor substrate, the semiconductor substrate having a first conductivity type of charge transfer region for transferring charge packets therein in one direction;

forming a plurality of first transfer electrodes on the first insulating layer, said first transfer electrodes being spaced from each other;

removing a portion of each of the first transfer electrodes to shape each of the first transfer electrodes into a staircase configuration;

implanting a first impurity into the surface of the semiconductor substrate to form an impurity diffusion region which comprises first, second and third subregions having different potentials relative to each other, the first and second subregions being formed underneath each of the first transfer electrodes, the third subregion being formed underneath each of areas of the first insulating layer between the first transfer electrodes;

depositing a mask on portions of said areas of the first insulating layer and on side portions of the first transfer electrodes; and implanting a second impurity into the surface of the semiconductor substrate using the mask to form a fourth subregion having a different potential from the third region.

3. A method according to claim 2, wherein said step of forming said first transfer electrodes comprises the steps of:

depositing a first film on said first insulating layer;
depositing a second film on said first film; and
patterning said first and second films into a plurality of islands serving as said first transfer electrodes.

4. A method according to claim 3, wherein said first film comprises a semiconductor film and said second film comprises a metal or metal semiconductor compound film.

5. A method according to claim 2, wherein said charge packets comprise electrons.

6. The method according to claim 2, further comprising the steps of:

after implanting the impurity of second conductivity type, depositing a second insulating layer on the first transfer electrodes; and
forming a plurality of second transfer electrodes on the areas of first insulating layers, respectively.

7. The method according to claim 2, wherein said first impurity has a second conductivity type different from the first conductivity type.

8. A method according to claim 7, wherein said step of depositing said first transfer electrodes comprises the steps of:

depositing a first film on said first insulating layer;
depositing a second film on said first film; and
patterning said first and second films into a plurality of islands serving as said first transfer electrodes.

9. A method according to claim 8, wherein said first film comprises a semiconductor film and said second film comprises a metal or metal semiconductor compound film.

10. The method according to claim 7, wherein said second impurity has the second conductivity type.

11. The method according to claim 7, wherein said first impurity has the first conductivity type.

12. The method according to claim 2, wherein said first impurity has the first conductivity type.

13. The method according to claim 12, wherein said second impurity has the first conductivity type.

14. A method of manufacturing a charge-coupled device, comprising the steps of:

depositing a first insulating layer on a semiconductor substrate, the semiconductor substrate having a first conductivity type of charge transfer region for transferring charge packets thereon in one direction;
forming a plurality of first transfer electrodes on said first insulating layer, said first transfer electrodes being spaced from each other, each of said transfer electrodes comprising a first film on said first insulating layer and a second film on said first film;
removing a portion of said second film of each of said first transfer electrodes to shape each of the first transfer electrodes into a staircase configuration;
implanting a first impurity into the surface of the semiconductor substrate to form an impurity diffusion region which comprises first, second and third subregions having different potentials relative to each other, the first and second subregions being formed underneath each of the first transfer electrodes, the third subregion being formed underneath each of areas of the first insulating layer between the first transfer electrodes;
depositing a mask on portions of the areas of said first insulating film and side portions of said first transfer electrodes;
implanting a second impurity into the surface of the semiconductor substrate using the mask to form a fourth subregion having a different potential from the third subregion;
removing said mask;
depositing a second insulating film on each of said first transfer electrodes; and
depositing a plurality of second transfer electrodes in said areas, respectively.

15. A method according to claim 14, wherein said first film comprises a semiconductor film and said second film comprises a metal or metal semiconductor compound film.

16. A method according to claim 14, wherein said charge packets comprise electrons.

17. A method according to claim 16, wherein said first impurity is of P-type, and said first, second, and third, subregions jointly develop a staircase-shaped distribution of different conductivities which increase progressively in said one direction.

18. A method according to claim 16, wherein said first impurity is of N-type, and said first, second, and third, subregions jointly develop a staircase-shaped distribution of different conductivities which increase progressively in said one direction.

19. A method according to claim 16, wherein said second impurity is of P-type, and said first, second, and third, subregions jointly develop a staircase-shaped distribution of different conductivities which increase progressively in said one direction.

20. A method according to claim 16, wherein said second impurity is of N-type, and said first, second, and third, subregions jointly develop a staircase-shaped distribution of different conductivities which increase progressively in said one direction.

* * * * *